US012198909B2

(12) United States Patent
Son (10) Patent No.: US 12,198,909 B2
(45) Date of Patent: Jan. 14, 2025

(54) APPARATUS FOR TREATING SUBSTRATE

(71) Applicant: SEMES CO., LTD., Chungcheongnam-do (KR)

(72) Inventor: Duk Hyun Son, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 602 days.

(21) Appl. No.: 17/477,708

(22) Filed: Sep. 17, 2021

(65) Prior Publication Data

US 2022/0093374 A1 Mar. 24, 2022

(30) Foreign Application Priority Data

Sep. 23, 2020 (KR) .................. 10-2020-0123002

(51) Int. Cl.
*H01J 37/32* (2006.01)
*H01J 37/21* (2006.01)
*H01L 21/67* (2006.01)

(52) U.S. Cl.
CPC ........ *H01J 37/32899* (2013.01); *H01J 37/21* (2013.01); *H01L 21/67196* (2013.01)

(58) Field of Classification Search
CPC .............. H01J 37/21; H01J 37/32249; H01J 37/32642; H01J 37/32715; H01J 37/32733; H01J 27/32899; H01L 21/67069; H01L 21/67126; H01L 21/67196; H01L 21/67201; H01L 21/67742; H01L 21/67766; H01L 21/67769; H01L 21/67775; H01L 21/68742; H01L 21/6875
(Continued)

(56) References Cited

U.S. PATENT DOCUMENTS 4,907,526 A * 3/1990 Walde .................. C23C 14/566
118/500
5,538,390 A * 7/1996 Salzman ........... H01L 21/67772
414/217

(Continued)

FOREIGN PATENT DOCUMENTS

JP   H07-335717 A   12/1995
KR   20070109298 A   11/2007
(Continued)

OTHER PUBLICATIONS

Written Decision on Registration dated Apr. 7, 2023 issued by the Korean Patent Office in corresponding Korean Patent Application No. 10-2020-0123002, with English translation.
(Continued)

*Primary Examiner* — Philip C Tucker
*Assistant Examiner* — Brian R Slawski
(74) *Attorney, Agent, or Firm* — Carter, DeLuca & Farrell LLP (57) ABSTRACT

An apparatus for treating a substrate includes a process chamber that treats the substrate, a buffer module that accommodates a ring member to be transported into the process chamber, and a load-lock chamber having an inner space. The buffer module includes a buffer chamber having a buffer space in which the ring member is accommodated, a support shelf that supports the ring member in the buffer space, and a drive member that moves the support shelf.

18 Claims, 7 Drawing Sheets

(58) Field of Classification Search
USPC ....... 414/217, 221, 935, 937, 939, 940, 941; 118/719, 50, 500; 204/298.25, 298.26, 204/298.35
See application file for complete search history.

(56) References Cited

U.S. PATENT DOCUMENTS

| | | | | |
|---|---|---|---|---|
| 5,752,796 | A * | 5/1998 | Muka | H01L 21/67772 414/416.03 |
| 2003/0103836 | A1* | 6/2003 | Beaulieu | H01L 21/67201 414/217 |
| 2004/0238122 | A1* | 12/2004 | Ishizawa | H01L 21/67201 156/345.31 |
| 2005/0205209 | A1* | 9/2005 | Mosden | H01L 21/67069 156/345.31 |
| 2008/0089774 | A1* | 4/2008 | Price | H01L 21/67178 414/805 |
| 2014/0124069 | A1 | 5/2014 | Hara | |
| 2014/0202921 | A1* | 7/2014 | Babbs | H01L 21/67201 206/710 |
| 2015/0340209 | A1* | 11/2015 | Koltonski | H01L 21/67742 156/345.31 |
| 2016/0284577 | A1* | 9/2016 | Ishizawa | H01L 21/67201 |
| 2017/0117170 | A1* | 4/2017 | Wong | H01L 21/67303 |
| 2021/0090917 | A1* | 3/2021 | Weaver | H01L 21/67201 |

FOREIGN PATENT DOCUMENTS

| | | |
|---|---|---|
| KR | 20130109680 A | 10/2013 |
| KR | 10-2014-0059727 A | 5/2014 |
| KR | 10-2017-0047149 A | 5/2017 |
| KR | 10-2017-0054248 A | 5/2017 |
| KR | 10-2017-0054253 A | 5/2017 |
| KR | 10-2090278 B1 | 3/2020 |
| KR | 10-2022-0039884 A | 3/2022 |

OTHER PUBLICATIONS

Office Action dated Oct. 27, 2022 issued by the Korean Patent Office in corresponding Korean Patent Application No. 10-2020-0123002, with English translation.

Chinese Office Action issued in corresponding CN Patent Application No. 202111115463.9, dated Jan. 11, 2024, with English translation.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2020-0123002 filed on Sep. 23, 2020, in the Korean Intellectual Property Office, the entire contents of which are hereby incorporated by reference.

BACKGROUND

Embodiments of the inventive concept described herein relate to an apparatus for treating a substrate.

Plasma refers to an ionized gaseous state of matter containing ions, radicals, and electrons. The plasma is generated by heating a neutral gas to a very high temperature or subjecting the neutral gas to a strong electric field or an RF electromagnetic field. A semiconductor element manufacturing process may include an etching process of removing a thin film on a substrate, such as a wafer, using plasma. The etching process is performed by collision or reaction of ions and/or radicals contained in the plasma with the thin film on the substrate.

An apparatus for treating a substrate using plasma includes a process chamber under a vacuum atmosphere, a support chuck that supports the substrate in the process chamber, and a focus ring that surrounds the substrate seated on the support chuck. The focus ring is installed to uniformly distribute plasma on the surface of the substrate and is etched together with the substrate by the plasma. When an etching process is repeatedly performed on the substrate, the focus ring is also etched together so that the shape of the focus ring is gradually changed. Due to the change in the shape of the focus ring, the direction in which ions and/or radicals are incident on the substrate is changed, and therefore the etching characteristics for the substrate are changed. Accordingly, when an etching process is performed on a predetermined number or more of substrates, or when the focus ring is deformed to deviate from an allowable range, it is necessary to replace the focus ring.

Figure 1:
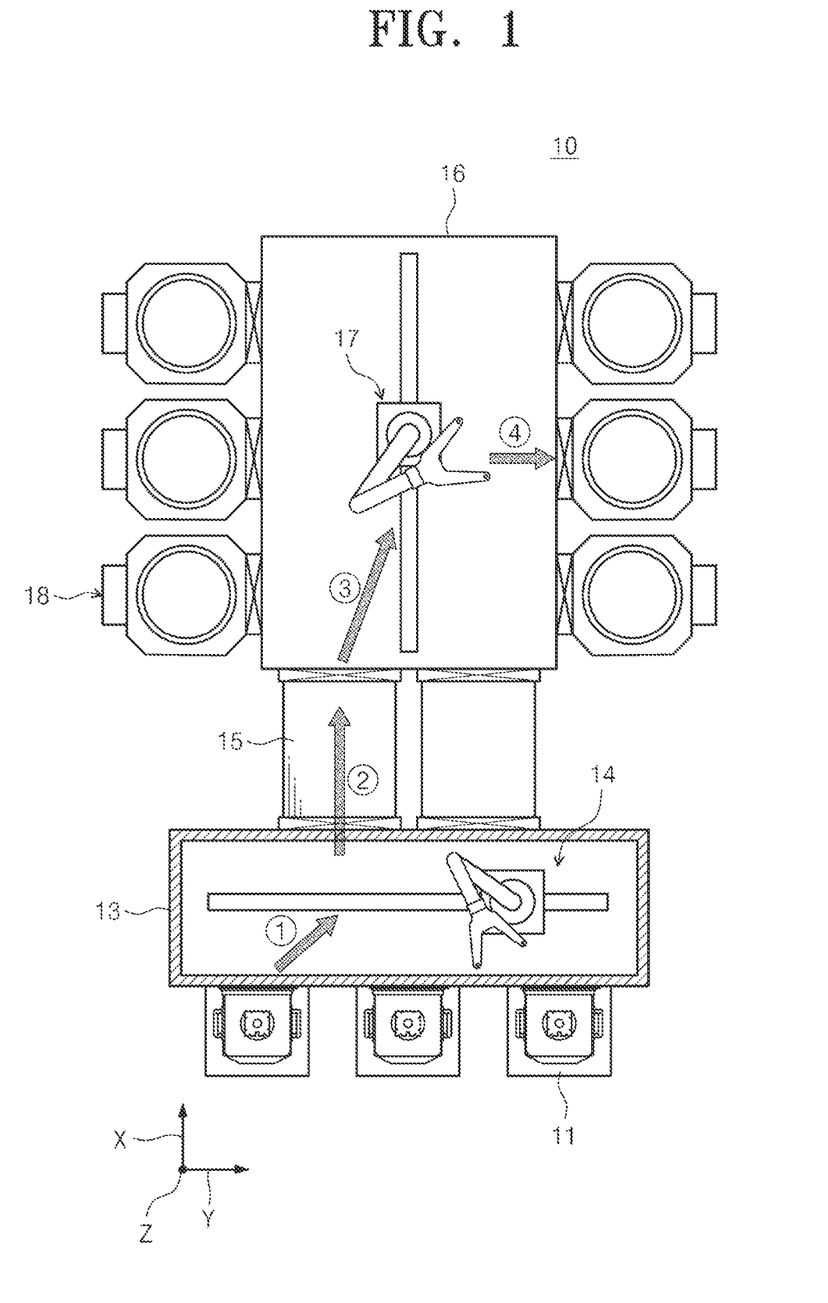
FIG. 1 is a view illustrating a transport sequence in which a focus ring is transported in a general substrate treating apparatus.

FIG. 1 is a view illustrating a transport sequence in which a focus ring is transported in a general substrate treating apparatus. Referring to FIG. 1, the general substrate treating apparatus 10 includes a load port 11 on which a carrier having substrates, such as wafers, or focus rings accommodated therein is seated, an atmospheric pressure chamber 13, the inside of which is maintained in an atmospheric pressure atmosphere, a first transport robot 14 that is provided in the atmospheric pressure chamber 13 and that transports a substrate or a focus ring in the carrier seated on the load port 11 to a load-lock chamber 15, the load-lock chamber 15, the inside of which is switched between an atmospheric pressure atmosphere and a vacuum atmosphere, a vacuum chamber 16, the inside of which is maintained in a vacuum atmosphere, and a second transport robot 17 that is provided in the vacuum chamber 16 and that transports the substrate or the focus ring from the load-lock chamber 15 to a process chamber 18 that treats the substrate.

As illustrated in FIG. 1, the transport sequence in which the focus ring is loaded into the process chamber 18 includes a first step of unloading the focus ring accommodated in the carrier seated on the load port 11 to the atmospheric pressure chamber 13, a second step of loading the focus ring unloaded to the atmospheric pressure chamber 13 into the load-lock chamber 15, a third step of unloading the focus ring loaded into the load-lock chamber 15 to the vacuum chamber 16, and a fourth step of loading the focus ring unloaded to the vacuum chamber 16 into the process chamber 18. The transport sequence in which the focus ring is unloaded from the process chamber 18 is performed in the reverse order of the four steps. That is, the general focus-ring replacement sequence is very complicated. Due to this, the time spent replacing the focus ring may be increased, which may lead to a decrease in the number of substrates that can be treated per hour. Furthermore, as the focus ring is replaced through several steps, the accuracy in transporting the focus ring may be deteriorated.

SUMMARY

Embodiments of the inventive concept provide a substrate treating apparatus for increasing the number of substrates that can be treated per hour.

Furthermore, embodiments of the inventive concept provide a substrate treating apparatus for improving the accuracy in transporting a ring member.

In addition, embodiments of the inventive concept provide a substrate treating apparatus for simplifying a transport sequence of a ring member.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for treating a substrate includes a process chamber that treats the substrate, a buffer module that accommodates a ring member to be transported into the process chamber, and a load-lock chamber having an inner space. The buffer module includes a buffer chamber having a buffer space in which the ring member is accommodated, a support shelf that supports the ring member in the buffer space, and a drive member that moves the support shelf.

According to an embodiment, the drive member may move the support shelf such that the ring member supported on the support shelf moves between the buffer space and the inner space.

According to an embodiment, the apparatus may further include a controller and a transport robot that transports the substrate or the ring member between the load-lock chamber and the process chamber. The controller may control the transport robot and the drive member such that the ring member is moved from the buffer space to the inner space and the transport robot unloads the ring member from the inner space and transports the ring member into the process chamber.

According to an embodiment, the buffer chamber may have an opening through which the ring member enters and exits the buffer chamber, and the buffer module may further include a door that selectively opens and closes the opening.

According to an embodiment, the apparatus may further include a shut-off valve that is provided between the buffer chamber and the load-lock chamber and that selectively fluidly connects the buffer space and the inner space.

According to an embodiment, the buffer chamber and the load-lock chamber may be disposed in an up/down direction.

According to an embodiment, the load-lock chamber may be disposed under the buffer chamber.

According to an embodiment, the buffer module may include a gas supply unit that supplies an inert gas into the buffer space and a pressure-reducing line that provides reduced pressure to the buffer space.

According to an embodiment, the apparatus may further include a load-lock module including the load-lock chamber, a gas supply line that supplies an inert gas into the inner space, and a pressure-reducing line that provides reduced pressure to the inner space.

According to an embodiment, the support shelf may include a support part that supports a lower surface of the ring member and an alignment pin inserted into an alignment recess formed on the lower surface of the ring member.

According to an embodiment, an apparatus for treating a substrate includes a process chamber that treats the substrate using plasma, a buffer chamber having a buffer space in which a ring member to be transported into the process chamber is accommodated, a load-lock chamber having an inner space, the pressure of which is switched between a vacuum atmosphere and an atmospheric atmosphere, a support shelf that supports the ring member in the buffer space, and a drive member that moves the ring member between the inner space and the buffer space.

According to an embodiment, the drive member may be coupled with the support shelf.

According to an embodiment, the apparatus may further include a shut-off valve that is provided between the buffer chamber and the load-lock chamber and that selectively fluidly connects the buffer space and the inner space.

According to an embodiment, the apparatus may further include a controller, and the controller may control the shut-off valve and the drive member such that the shut-off valve is opened to fluidly connect the buffer space and the inner space and the drive member moves the support shelf to move the ring member from the buffer space to the inner space.

According to an embodiment, the apparatus may further include a transport robot that transports the substrate or the ring member between the load-lock chamber and the process chamber. The controller may control the transport robot and the drive member to unload the ring member moved into the inner space from the inner space and to transport the ring member into the process chamber.

According to an embodiment, the apparatus may further include a first gas supply line that supplies a gas into the inner space, a first pressure-reducing line that provides reduced pressure to the inner space, a second gas supply line that supplies a gas into the buffer space, and a second pressure-reducing line that provides reduced pressure to the buffer space.

According to an embodiment, the support shelf may include a support part that supports a lower surface of the ring member and an alignment pin inserted into an alignment recess formed on the lower surface of the ring member.

According to an embodiment, an apparatus for treating a substrate includes an index unit having a load port on which a carrier having the substrate accommodated therein is seated and a process unit having a process chamber that treats the substrate using plasma and that is equipped with a ring member. The index unit includes an index chamber provided between the load port and the process unit, the inside of the index chamber being maintained in an atmospheric atmosphere and a first transport robot that transports the substrate accommodated in the carrier to the process unit. The process unit includes a load-lock chamber having an inner space, the pressure of which is switched between a vacuum atmosphere and an atmospheric atmosphere, a buffer chamber that is disposed over the load-lock chamber and that has a buffer space in which the ring member is accommodated, a second transport robot that unloads the substrate or the ring member from the load-lock chamber and transports the substrate or the ring member into the process chamber, a support shelf that supports the ring member in the buffer space, and a drive member that moves the support shelf.

According to an embodiment, the drive member may move the support shelf such that the ring member supported on the support shelf moves between the buffer space and the inner space.

According to an embodiment, the buffer chamber may have an opening through which the ring member enters and exits the buffer chamber, and the apparatus may further include a door that selectively opens and closes the opening.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described with reference to FIGS. 2 to 8.

Figure 2:
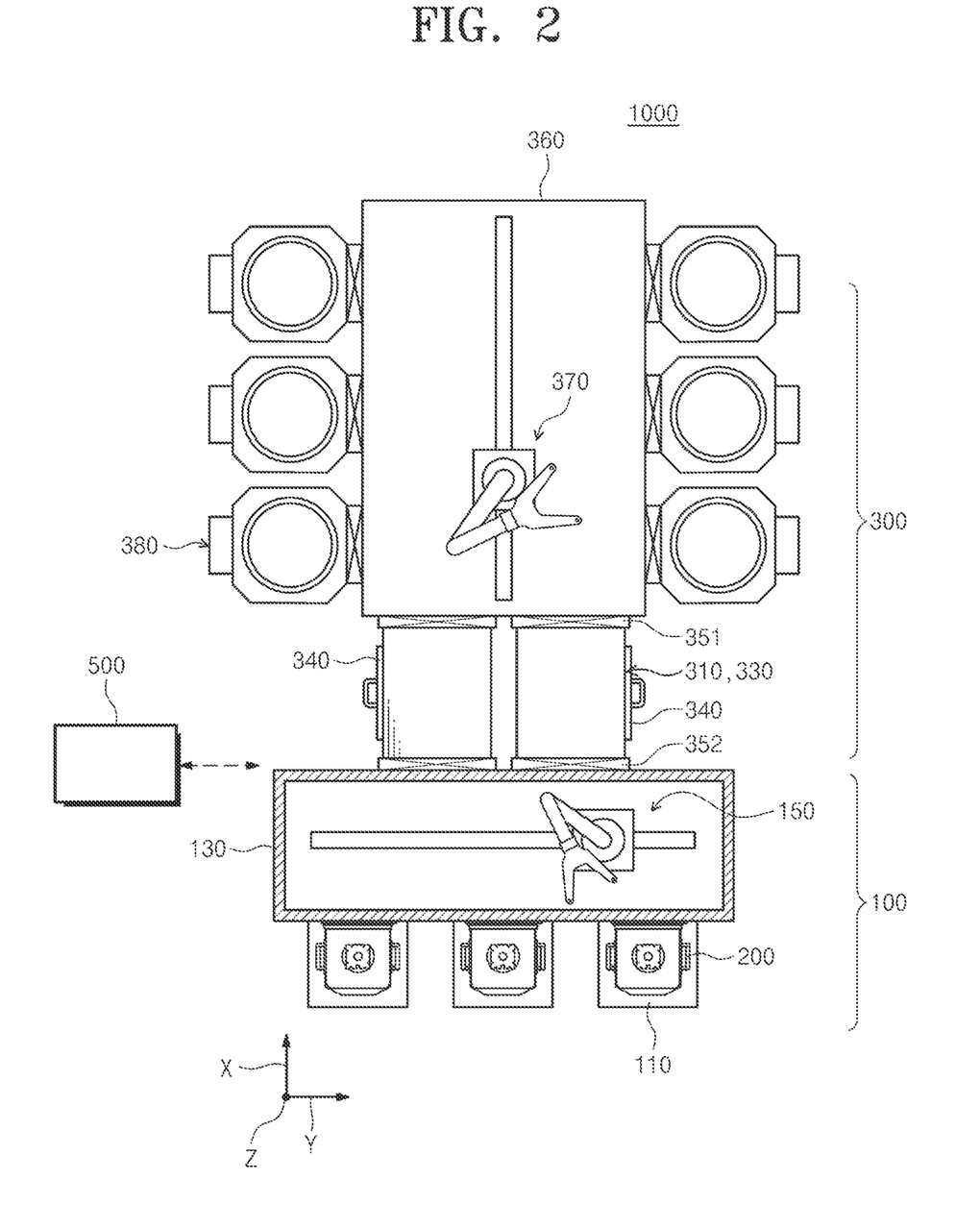
FIG. 2 is a schematic view illustrating a substrate treating apparatus according to an embodiment of the inventive concept.

FIG. 2 is a schematic plan view illustrating a substrate treating apparatus according to an embodiment of the inventive concept. Referring to FIG. 2, the substrate treating apparatus 1000 according to the embodiment of the inventive concept may include an index unit 100, a process unit 300, and a controller 500. The index unit 100 and the process unit 300 may be arranged in a first direction X when viewed from above. Hereinafter, a direction perpendicular to the first direction X when viewed from above is defined as a second direction Y. Furthermore, a direction perpendicular to the first direction X and the second direction Y is defined as a third direction Z. Here, the third direction Z may refer to the direction perpendicular to the ground.

The index unit 100 may include load ports 110, an index chamber 130, and a first transport robot 150.

Carriers 200 may be seated on the load ports 110. Substrates W (e.g., wafers) to be transported to the process unit 300 may be accommodated in at least some of the carriers 200 seated on the load ports 110. The carriers 200 may be transported and loaded onto the load ports 110, or may be unloaded from the load ports 110 and transported, by a carrier transport apparatus. The carrier transport apparatus may be an overhead transport apparatus (OHT). However, the inventive concept is not limited thereto, and the carriers 200 may be transported by various apparatuses for transporting the carriers 200. Furthermore, an operator may directly load the carriers 200 onto the load ports 110, or may directly unload the carriers 200 from the load ports 110.

The index chamber 130 may be provided between the load ports 110 and the process unit 300. The inside of the index chamber 130 may be maintained in an atmospheric atmosphere. The first transport robot 150 may be provided in the index chamber 130. The first transport robot 150 may transport the substrates W accommodated in the carriers 200 into an inner space 312 of a load-lock chamber 311 that will be described below.

The process unit 300 may include a load-lock module 310, a shut-off valve 320, a buffer module 330, gate valves 351 and 352, a transfer chamber 360, a second transport robot 370, and process chambers 380.

The transfer chamber 360 may be disposed between the load-lock module 310 and the process chambers 380. The inside of the transfer chamber 360 may be maintained in a vacuum atmosphere. The second transport robot 370 may be provided in the transfer chamber 360. The second transport robot 370 may transport the substrates W or ring members FR between the load-lock module 310 and the process chambers 380. As illustrated in FIG. 2, the second transport robot 370 may move along a track or guide in the transfer chamber 360. Unlike that illustrated in FIG. 2, the second transport robot 370 may be accessible to all of the process chambers 380 coupled to the transfer chamber 360 without travel.

In an embodiment, a plurality of transfer modules may be coupled such that the transfer chamber 360 is implemented in a modular form. The transfer chamber 360 illustrated in FIG. 2 may be one transfer module. Although not illustrated in FIG. 2, an additional modular transfer module may be coupled to the transfer chamber 360. One or more transfer chambers 360 may be coupled to one transfer module. The number of transfer modules and the number of transfer chambers 360 coupled to the transfer modules are not limited to the embodiment illustrated in FIG. 2. When a plurality of transfer modules are coupled, the second transport robot 370 may move in the plurality of transfer modules. One or more second transport robots 370 may be provided. The second transport robots 370 may be disposed in the respective transfer modules.

One or more process chambers 380 may be connected to the transfer chamber 360. The process chambers 380 may be chambers that perform a process on a substrate W. For example, the process chambers 380 may be liquid treatment chambers that treat a substrate W by dispensing a treatment liquid onto the substrate W. Alternatively, the process chambers 380 may be plasma chambers that treat a substrate W by using plasma. In another case, some of the process chambers 380 may be liquid treatment chambers that treat a substrate W by dispensing a treatment liquid onto the substrate W, and the other process chambers 380 may be plasma chambers that treat a substrate W by using plasma. However, without being limited thereto, the substrate treating processes performed in the process chambers 380 may be variously modified with well-known substrate treating processes. When the chambers 380 are plasma chambers that treat a substrate W by using plasma, the plasma chambers may be chambers that perform an etching or ashing process of removing a thin film on a substrate W by using plasma. However, without being limited thereto, the plasma treatment process performed in the process chambers 380 may be variously modified with well-known plasma treatment processes.

The controller 500 may control the substrate treating apparatus 1000. The controller 500 may include a process controller, a user interface, and a storage unit. The process controller may be implemented with a microprocessor (a computer) that executes the control of the substrate treating apparatus 1000. The user interface may include a keyboard through which an operator inputs a command to manage the substrate treating apparatus 1000 or a display that visually displays an operational state of the substrate treating apparatus 1000. The storage unit may store a process recipe, such as a control program for executing a process performed in the substrate treating apparatus 1000 under the control of the process controller or a program for causing each component to execute a process according to various types of data and process conditions. The user interface and the storage unit may be connected to the process controller. The process recipe may be stored in a storage medium of the storage unit. The storage medium may be a hard disk, a portable disk such as CD-ROM or DVD, or a semiconductor memory such as a flash memory.

The controller 500 may control the substrate treating apparatus 1000 to perform a treatment process on a substrate W. For example, the controller 500 may control the substrate treating apparatus 1000 to unload a substrate W to be treated from a carrier 200 having the substrate W accommodated therein and transport the unloaded substrate W into a process chamber 380.

Furthermore, when a predetermined number of substrates W are treated in a process chamber 380 or a ring member FR in the process chamber 380 is deformed to deviate from an allowable range, the controller 500 may control the substrate treating apparatus 1000 to replace the ring member FR in the process chamber 380. For example, the controller 500 may control the second transport robot 370 to unload the used ring member FR from the process chamber 380. Furthermore, the controller 500 may control the second transport robot 370 to transport the used ring member FR unloaded from the process chamber 380 into the load-lock module 310. In addition, the controller 500 may control the second transport robot 370 to transport an unused ring member FR from the load-lock module 310 into the process chamber 380.

Hereinafter, the load-lock module 310, the shut-off valve 320, and the buffer module 330 according to an embodiment of the inventive concept will be described in detail.

Figure 3:
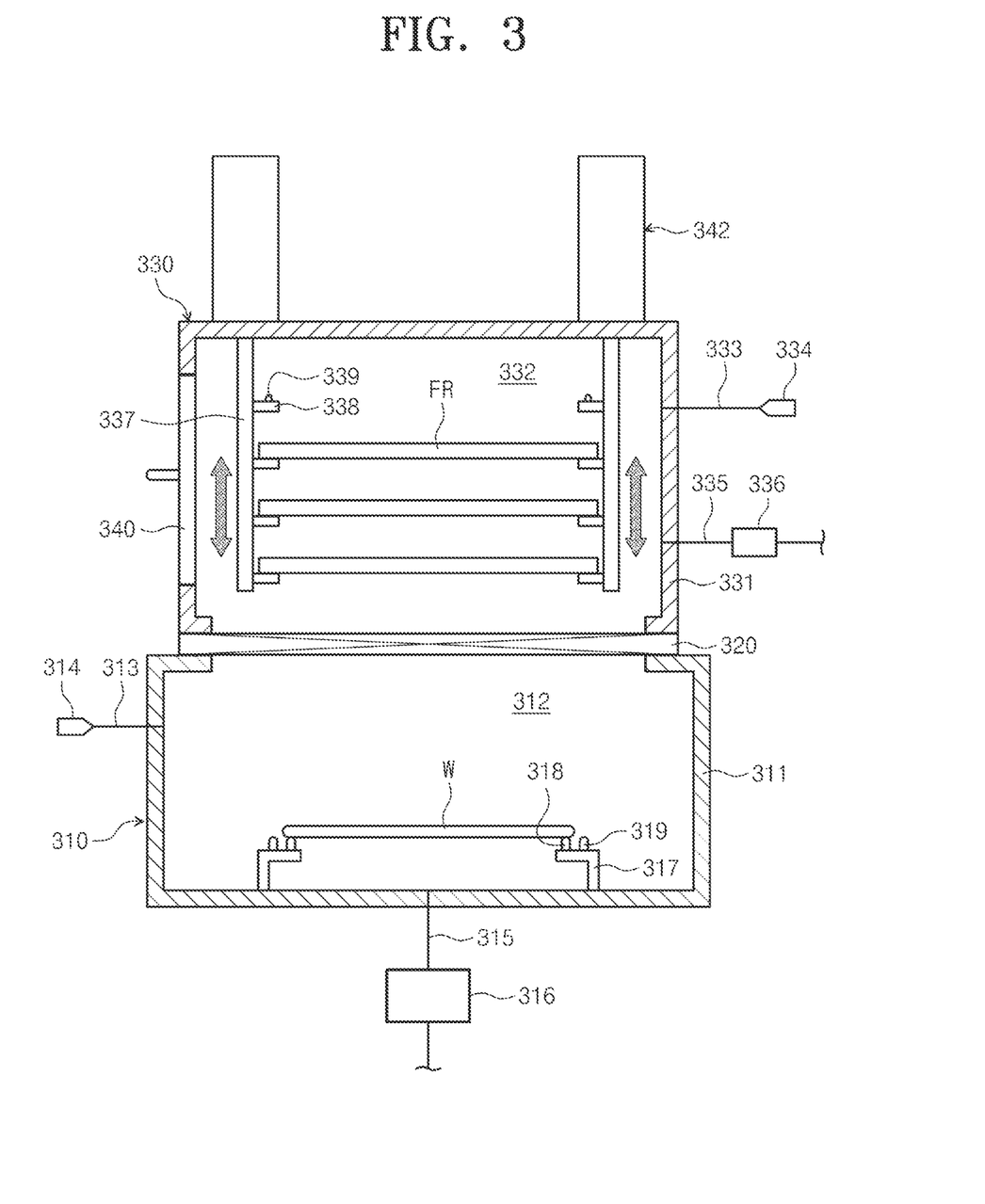
FIG. 3 is a view illustrating a load-lock module and a buffer module of FIG. 2.

FIG. 3 is a view illustrating the load-lock module and the buffer module of FIG. 2. Referring to FIG. 3, the load-lock module 310 may include the load-lock chamber 211, a first gas supply line 313, a first gas supply source 314, a first pressure-reducing line 315, a first pressure-reducing member 316, and a support member 317. The load-lock module 310 may provide the inner space 312 in which a substrate W is temporarily stored such that the substrate W transported from the index chamber 130 having an atmospheric atmosphere is transported to the transfer chamber 360 having a vacuum atmosphere.

The load-lock chamber 311 may have the inner space 312. The inner space 312 may be a space in which the substrate W and/or a ring member FR is temporarily stored. The substrate W may be a wafer. Alternatively, the substrate W may refer to a substrate-type sensor. The substrate-type sensor may be loaded into the process chamber 380 and may monitor a process performed in the process chamber 380. The ring member FR may be a process kit that is provided in the process chamber 380. The ring member FR may be a focus ring. Alternatively, the ring member FR may be a quartz ring (or, an insulating ring).

The first gas supply line 313 connected with the first gas supply source 314 may supply a gas into the inner space 312. The gas supplied by the first gas supply line 313 may be an inert gas. The inert gas may be a gas containing nitrogen or argon. However, without being limited thereto, the inert gas may be variously modified with well-known inert gases. The first pressure-reducing line 315 connected with the first pressure-reducing member 316 may provide reduced pressure to the inner space 312. The first pressure-reducing member 316 may be a pump. However, without being limited thereto, the first pressure-reducing member 316 may be implemented with various well-known apparatuses capable of providing reduced pressure. As the first gas supply line 313 supplies the gas into the inner space 312 and the first pressure-reducing member 316 provides reduced pressure to the inner space 312, the pressure in the inner space 312 may be switched between a vacuum atmosphere and an atmospheric atmosphere.

The load-lock chamber 311 may have openings formed at the front and rear thereof. The opening formed at the front of the load-lock chamber 311 may be an opening adjacent to the transfer chamber 360. The opening formed at the rear of the load-lock chamber 311 may be an opening adjacent to the index chamber 130. The openings formed at the front and rear of the load-lock chamber 311 may be selectively opened and closed by the gate valves 351 and 352, respectively. For example, as illustrated in FIG. 2, the opening formed at the front of the load-lock chamber 311 may be selectively opened and closed by the first gate valve 351. The opening formed at the rear of the load-lock chamber 311 may be selectively opened and closed by the second gate valve 352.

Figure 4:
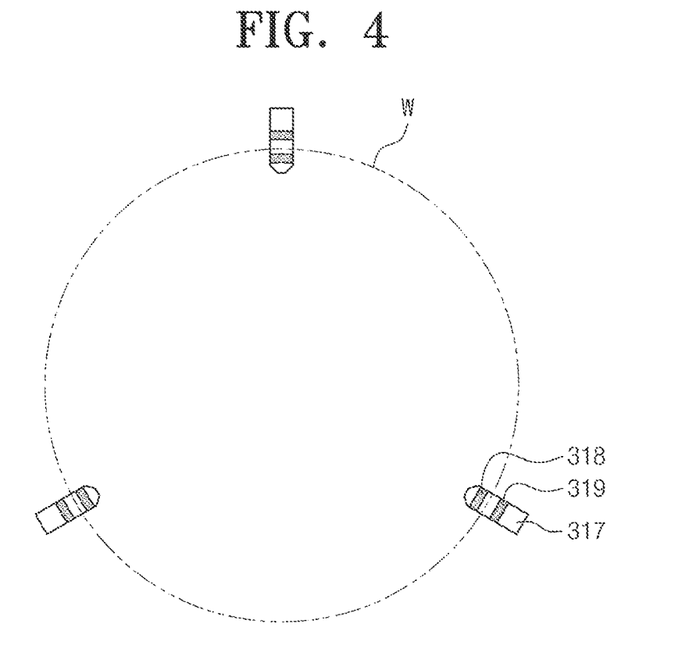
FIG. 4 is a schematic view illustrating a state in which a substrate is seated on support members of FIG. 3.
Figure 5:
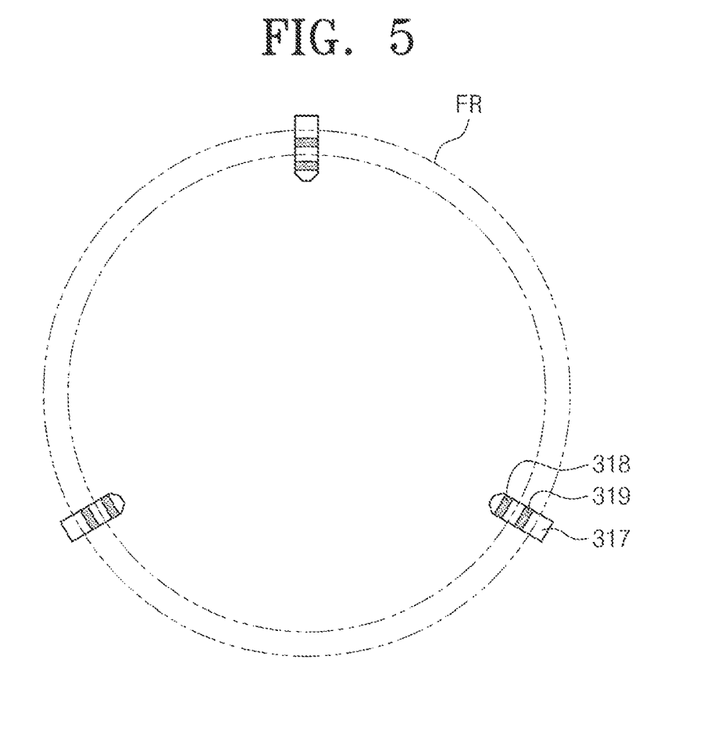
FIG. 5 is a schematic view illustrating a state in which a ring member is seated on the support members of FIG. 3.
Figure 6:
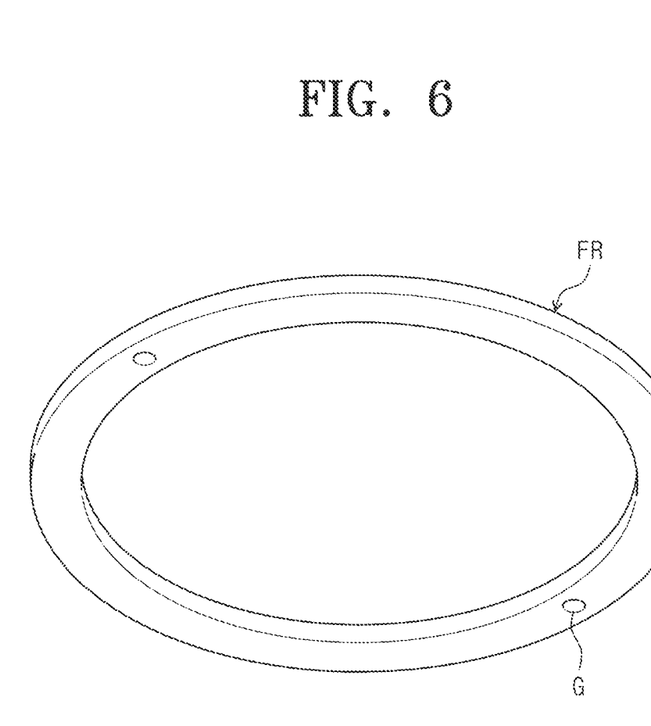
FIG. 6 is a view illustrating a ring member seated on a support shelf of FIG. 3.

Referring again to FIG. 3, the support member 317 may support the substrate W. The support member 317 may support the substrate W in the inner space 312. A first pad 318 and a second pad 319 may be provided on the upper surface of the support member 317. The second pad 319 may be located farther away from the center of the substrate W supported on the support member 317 than the first pad 318. One or more support members 317 may be provided. For example, a plurality of support members 317 may be provided. For example, as illustrated in FIG. 4, three support members 317 may support the lower surface of the substrate W. When the substrate W, such as a wafer, is supported by the support members 317, the lower surface of the substrate W may be brought into contact with the first pads 318. Furthermore, as illustrated in FIG. 5, the lower surface of the ring member FR may be brought into contact with the second pads 319 when the ring member FR is supported by the support members 317. That is, as the first pads 318 and the second pads 319 are provided on the upper surfaces of the support members 317 according to the embodiment of the inventive concept, the support members 317 may selectively support the substrate W or the ring member FR.

Referring again to FIG. 3, the buffer module 330 may include a buffer chamber 331, a second gas supply line 333, a second gas supply source 334, a second pressure-reducing line 335, a second pressure-reducing member 336, a support shelf 337, a drive member 342, and a door 340. The buffer module 330 may accommodate ring members FR to be transported into the process chambers 380.

The buffer chamber 331 may have a buffer space 332. The buffer space 332 may be a space in which the ring members FR are accommodated. The second gas supply line 333 connected with the second gas supply source 334 may supply a gas into the buffer space 332. The gas supplied by the second gas supply line 333 may be an inert gas. The inert gas may be a gas containing nitrogen or argon. However, without being limited thereto, the inert gas may be variously modified with well-known inert gases. The second pressure-reducing line 335 connected with the second pressure-reducing member 336 may provide reduced pressure to the buffer space 332.

The second pressure-reducing member 336 may be a pump. However, without being limited thereto, the second pressure-reducing member 336 may be implemented with various well-known apparatuses capable of providing reduced pressure. As the second gas supply line 333 supplies the gas into the buffer space 332 and the second pressure-reducing member 336 provides reduced pressure to the buffer space 332, the pressure in the buffer space 332 may be switched between a vacuum atmosphere and an atmospheric atmosphere.

The support shelf 337 may support the ring members FR in the buffer space 332. The support shelf 337 may extend in an up/down direction and may include one or more support parts 338. For example, the support shelf 337 may include a plurality of support parts 338. The support parts 338 may support the lower surfaces of the ring members FR. The support shelf 337 may include alignment pins 339. The alignment pins 339 may be inserted into alignment recesses G formed on the lower surfaces of the ring members FR (refer to FIG. 6). A user may open the door 340 capable of selectively opening and closing the opening that is formed in the sidewall of the buffer chamber 331 and through which the ring members FR enter and exit the buffer chamber 331. The user may load the ring members FR into the buffer space 332 and may place the ring members FR on the support shelf 337. At this time, the alignment pins 339 may be inserted into the alignment recesses G of the ring members FR. That is, the positions of the ring members FR may be appropriately aligned irrespective of the user's proficiency, and thus the ring members FR may be more accurately transported.

The drive member 342 may move the support shelf 337. The drive member 342 may be coupled with the support shelf 337. The drive member 342 may move the support shelf 337 such that the ring members FR supported on the support shelf 337 move between the buffer space 332 and the inner space 312. The drive member 342 may be an LM guide that moves the support shelf 337. However, without being limited thereto, the drive member 342 may be implemented with various well-known apparatuses that move the support shelf 337 upward and downward.

The load-lock chamber 311 and the buffer chamber 331 may be disposed in the up/down direction. For example, the buffer chamber 331 may be disposed over the load-lock chamber 311. The shut-off valve 320 may be provided between the buffer chamber 331 and the load-lock chamber 311. The shut-off valve 320 may selectively fluidly connect the buffer space 332 of the buffer chamber 331 and the inner space 312 of the load-lock chamber 311. For example, the shut-off valve 320 may isolate the buffer space 332 and the inner space 312 from each other when the substrate W is loaded into the inner space 312 of the load-lock chamber 311. Furthermore, the shut-off valve 320 may fluidly connect the buffer space 332 and the inner space 312 when the ring members FR are replaced. Accordingly, the support shelf 337 may move downward to move the ring members FR from the buffer space 332 to the inner space 312.

Figure 7:
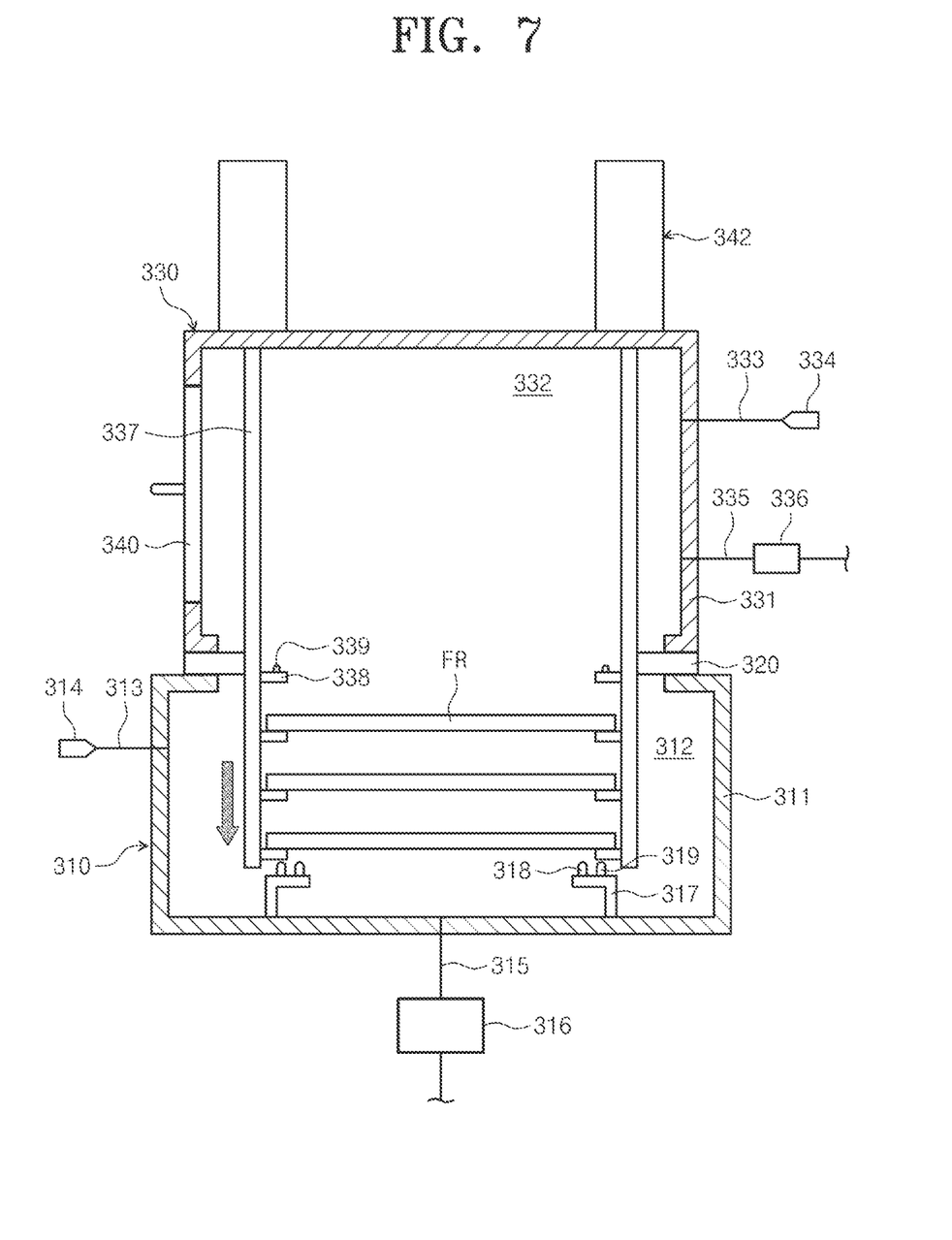
FIG. 7 is a view illustrating a state in which a drive member of FIG. 3 moves a ring member.
Figure 8:
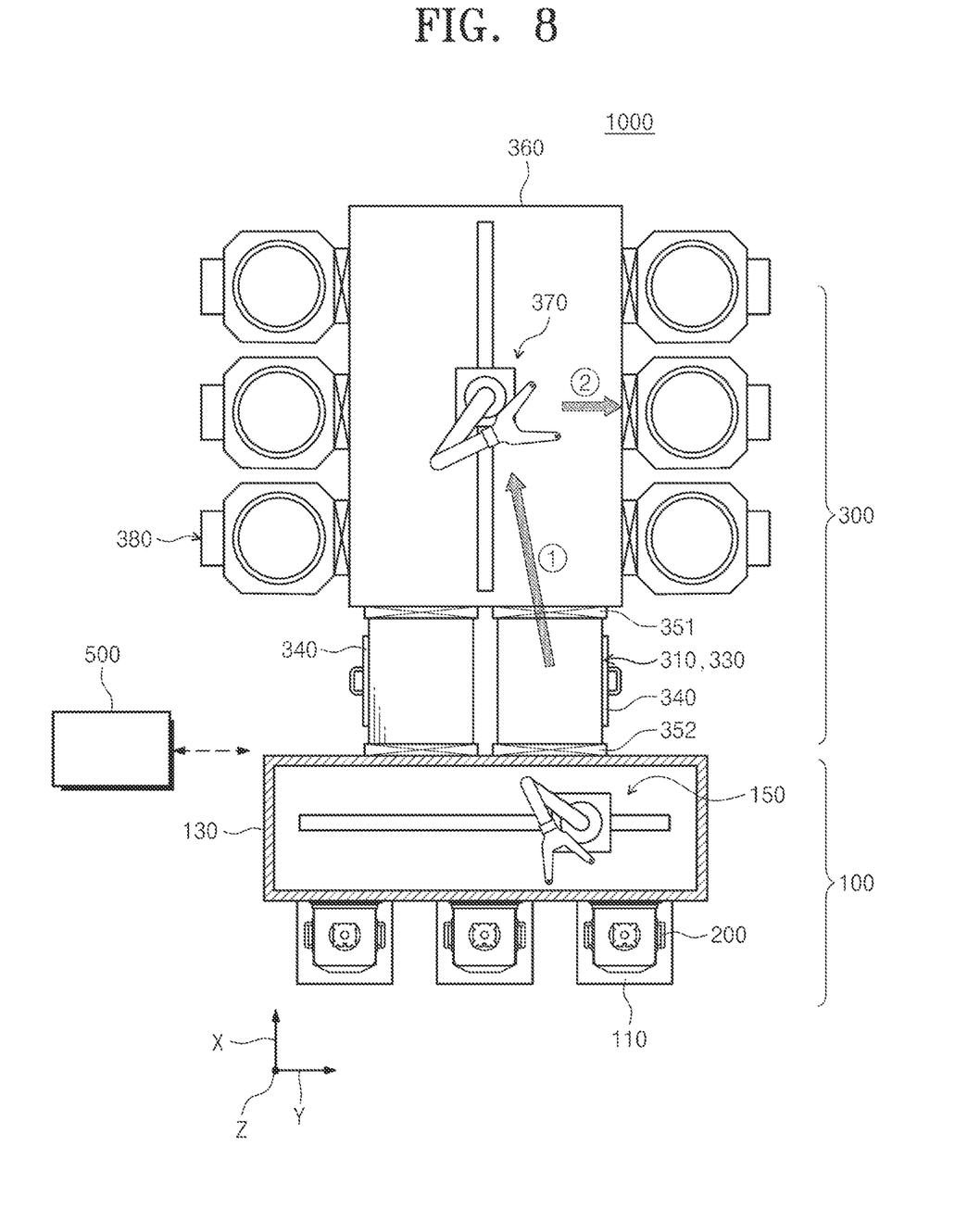
FIG. 8 is a view illustrating a transport sequence in which a ring member is transported in the substrate treating apparatus according to an embodiment of the inventive concept.

FIG. 7 is a view illustrating a state in which the drive member of FIG. 3 moves a ring member, and FIG. 8 is a view illustrating a transport sequence in which a ring member is transported in the substrate treating apparatus according to an embodiment of the inventive concept. Hereinafter, the transport sequence of the ring member according to the embodiment of the inventive concept will be described in detail with reference to FIGS. 7 and 8. To perform the transport sequence to be described below, the controller 500 may control the substrate treating apparatus 1000. For example, to perform the transport sequence to be described below, the controller 500 may control the load-lock module 310, the buffer module 330, the gate valves 351 and 352, the transfer chamber 360, the second transport robot 370, and the process chamber 380. Furthermore, to perform the transport sequence to be described below, the controller 500 may control the drive member 342, the shut-off valve 320, the first gas supply source 314, the first pressure-reducing member 316, the second gas supply source 334, and the second pressure-reducing member 336.

First, the transport sequence in which the ring member FR is loaded into the process chamber 380 will be described.

Before a user loads the ring member FR into the buffer chamber 331, the pressure in the buffer space 332 may be switched to an atmospheric pressure state. For example, before the user loads the ring member FR into the buffer chamber 331, the second gas supply source 334 may supply the gas into the buffer space 332 and may switch the pressure in the buffer space 332 to the atmospheric pressure state. At this time, the shut-off valve 320 may be closed to isolate the buffer space 332 and the inner space 312 from each other.

When the pressure in the buffer space 332 is completely switched to the atmospheric pressure state, the user may open the door 340 and may load the ring member FR into the buffer space 332. The loaded ring member FR may be placed on the support part 338 of the support shelf 337. As described above, the alignment pins 339 may be provided on the support shelf 337. The alignment pins 339 may be inserted into the alignment recesses G formed on the ring member FR. Accordingly, the user may locate the ring member FR in a correct position by only mounting the alignment recesses G on the alignment pins 339.

When the ring member FR is completely loaded into the buffer space 332, the pressure in the buffer space 332 may be switched to a vacuum atmosphere. For example, when the ring member FR is completely loaded into the buffer space 332, the second pressure-reducing member 336 may provide reduced pressure to the buffer space 332 to switch the atmosphere of the buffer space 332 to the vacuum atmosphere.

When the atmosphere of the buffer space 332 is switched to the vacuum atmosphere, the gate valve 320 may fluidly connect the buffer space 332 and the inner space 312.

When the gate valve 320 fluidly connects the buffer space 332 and the inner space 312, the drive member 342 may move the support shelf 337. Specifically, the drive member 342 may move the support shelf 337 downward to move the ring member FR from the buffer space 332 to the inner space 312.

When the ring member FR is moved from the buffer space 332 to the inner space 312, the first gate valve 351 may be opened. Thereafter, the second transport robot 370 may unload the ring member FR from the inner space 312 and may transport the ring member FR into the process chamber 380.

The transport sequence in which the ring member FR is unloaded from the process chamber 380 may be performed in the reverse order of the above-described embodiment. However, when the ring member FR used in the process chamber 380 is loaded into the buffer chamber 331, the used ring member FR may be transported to a lower position than unused ring members FR supported on the support parts 338 and may be supported by the support shelf 337. This is to minimize the delivery of impurities attached to the used ring member FR to the unused ring members FR.

The transport sequence of the ring member FR according to the embodiment of the inventive concept includes unloading the ring member FR from the load-lock chamber 311 to the transfer chamber 360 (the first step) and loading the ring member FR unloaded to the transfer chamber 360 into the process chamber 380 (the second step). In contrast, as illustrated in FIG. 1, the transport sequence of the ring member FR in the general substrate treating apparatus includes unloading the ring member FR from the carrier 200 (the first step), loading the ring member FR into the load-lock chamber 311 (the second step), unloading the ring member FR to the transfer chamber 360 (the third step), and loading the ring member FR into the process chamber 380 (the fourth step). In other words, a total of four steps are performed until the ring member FR is loaded into the process chamber 380 in the general substrate treating apparatus.

According to the embodiment of the inventive concept, the process of unloading the ring member FR from the carrier 200 and the process of loading the ring member FR from the index chamber 130 to the load-lock chamber 311 are omitted, and thus the transport sequence of the ring member FR may be further simplified. As the transport sequence of the ring member FR is simplified, the accuracy in transporting the ring member FR may be improved. In addition, the number of substrates W that can be treated per hour in the substrate treating apparatus 1000 may be increased.

According to the embodiments of the inventive concept, the substrate treating apparatus may increase the number of substrates that can be treated per hour.

Furthermore, according to the embodiments of the inventive concept, the substrate treating apparatus may improve the accuracy in transporting a ring member.

In addition, according to the embodiments of the inventive concept, the substrate treating apparatus may simplify a transport sequence of a ring member.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a process chamber configured to treat the substrate;
   a buffer module comprising a ring member configured to be transported into the process chamber; and
   a load-lock chamber having an inner space,
   wherein the buffer module includes:
      a buffer chamber having a buffer space in which the ring member is accommodated;
      a support shelf configured to support the ring member in the buffer space; and
      a drive member configured to move the support shelf, and
   wherein the drive member moves the support shelf such that the ring member supported on the support shelf moves between the buffer space and the inner space.

2. The apparatus of claim 1, further comprising:
   a controller; and
   a transport robot configured to transport the substrate or the ring member between the load-lock chamber and the process chamber,
   wherein the controller controls the transport robot and the drive member such that the ring member is moved from the buffer space to the inner space and the transport robot unloads the ring member from the inner space and transports the ring member into the process chamber.

3. The apparatus of claim 1, wherein the buffer chamber has an opening through which the ring member enters and exits the buffer chamber, and
   wherein the buffer module further includes a door configured to selectively open and close the opening.

4. The apparatus of claim 1, further comprising:
   a shut-off valve provided between the buffer chamber and the load-lock chamber and configured to selectively fluidly connect the buffer space and the inner space.

5. The apparatus of claim 1, wherein the buffer chamber and the load-lock chamber are disposed in an up/down direction.

6. The apparatus of claim 5, wherein the load-lock chamber is disposed under the buffer chamber.

7. The apparatus of claim 1, wherein the buffer module includes:
   a gas supply unit configured to supply an inert gas into the buffer space; and
   a pressure-reducing line configured to provide reduced pressure to the buffer space.

8. The apparatus of claim 1, further comprising:
   a load-lock module including the load-lock chamber, a gas supply line configured to supply an inert gas into the inner space, and a pressure-reducing line configured to provide reduced pressure to the inner space.

9. The apparatus of claim 1, wherein the support shelf includes:
   a support part configured to support a lower surface of the ring member; and
   an alignment pin inserted into an alignment recess formed on the lower surface of the ring member.

10. An apparatus for treating a substrate, the apparatus comprising:
    a process chamber configured to treat the substrate using plasma;
    a buffer chamber having a buffer space and comprising a ring member configured to be transported into the process chamber;
    a load-lock chamber having an inner space, the pressure of which is switched between a vacuum atmosphere and an atmospheric atmosphere;
    a support shelf configured to support the ring member in the buffer space; and
    a drive member configured to move the ring member between the inner space and the buffer space.

11. The apparatus of claim 10, wherein the drive member is coupled with the support shelf.

12. The apparatus of claim 10, further comprising:
    a shut-off valve provided between the buffer chamber and the load-lock chamber and configured to selectively fluidly connect the buffer space and the inner space.

13. The apparatus of claim 12, further comprising:
    a controller,
    wherein the controller controls the shut-off valve and the drive member such that the shut-off valve is opened to fluidly connect the buffer space and the inner space and the drive member moves the support shelf to move the ring member from the buffer space to the inner space.

14. The apparatus of claim 13, further comprising:
    a transport robot configured to transport the substrate or the ring member between the load-lock chamber and the process chamber,
    wherein the controller controls the transport robot and the drive member to unload the ring member moved into the inner space from the inner space and to transport the ring member into the process chamber.

15. The apparatus of claim 10, further comprising:
    a first gas supply line configured to supply a gas into the inner space;
    a first pressure-reducing line configured to provide reduced pressure to the inner space;

a second gas supply line configured to supply a gas into the buffer space; and a second pressure-reducing line configured to provide reduced pressure to the buffer space.

16. The apparatus of claim 10, wherein the support shelf includes:

a support part configured to support a lower surface of the ring member; and an alignment pin inserted into an alignment recess formed on the lower surface of the ring member.

17. An apparatus for treating a substrate, the apparatus comprising:

an index unit having a load port on which a carrier having the substrate accommodated therein is seated; and a process unit having a process chamber configured to treat the substrate using plasma and equipped with a ring member, wherein the index unit includes:

an index chamber provided between the load port and the process unit, the inside of the index chamber being maintained in an atmospheric atmosphere; and a first transport robot configured to transport the substrate accommodated in the carrier to the process unit, and wherein the process unit includes:

a load-lock chamber having an inner space, the pressure of which is switched between a vacuum atmosphere and an atmospheric atmosphere;

a buffer chamber disposed over the load-lock chamber, the buffer chamber having a buffer space in which the ring member is accommodated;

a second transport robot configured to unload the substrate or the ring member from the load-lock chamber and transport the substrate or the ring member into the process chamber;

a support shelf configured to support the ring member in the buffer space; and a drive member configured to move the support shelf, and wherein the drive member moves the support shelf such that the ring member supported on the support shelf moves between the buffer space and the inner space.

18. The apparatus of claim 17, wherein the buffer chamber has an opening through which the ring member enters and exits the buffer chamber, and wherein the apparatus further comprises a door configured to selectively open and close the opening.

\* \* \* \* \*